US012796106B2

(12) United States Patent
Li et al.

(10) Patent No.: US 12,796,106 B2
(45) Date of Patent: Nov. 10, 2026

(54) SEMICONDUCTOR STRUCTURE AND METHOD OF MANUFACTURING THE SAME

(71) Applicant: NANYA TECHNOLOGY CORPORATION, New Taipei City (TW)

(72) Inventors: Meng-Zhen Li, New Taipei City (TW); Hsueh-Han Lu, New Taipei City (TW); Ming Hsun Wu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 290 days.

(21) Appl. No.: 18/653,468

(22) Filed: May 2, 2024

(65) Prior Publication Data

US 2025/0344510 A1 Nov. 6, 2025

(51) Int. Cl.

| | |
|---|---|
| ***H10D 89/10*** | (2025.01) |
| ***H10D 84/01*** | (2026.01) |
| ***H10D 84/03*** | (2025.01) |
| ***H10D 84/83*** | (2025.01) |
| ***H10P 74/00*** | (2026.01) |
| ***H10P 74/20*** | (2026.01) |
| ***H10W 70/00*** | (2026.01) |

(52) U.S. Cl.

CPC ........... *H10D 89/10* (2025.01); *H10D 84/013* (2025.01); *H10D 84/038* (2025.01); *H10D 84/83* (2025.01); *H10P 74/207* (2026.01); *H10P 74/273* (2026.01); *H10P 74/277* (2026.01); *H10W 70/00* (2026.01)

(58) Field of Classification Search

CPC .... H10P 74/207; H10P 74/273; H10P 74/277; H10D 89/10

See application file for complete search history.

(56) References Cited

U.S. PATENT DOCUMENTS

| | | | |
|---|---|---|---|
| 2001/0003050 | A1 | 6/2001 | Onozawa |
| 2003/0062521 | A1 | 4/2003 | Jang et al. |
| 2023/0352487 | A1 | 11/2023 | Yan et al. |

*Primary Examiner* — Matthew L Reames

(74) *Attorney, Agent, or Firm* — CKC & Partners Co., LLC

(57) ABSTRACT

A semiconductor structure comprises a substrate, a first transistor, a second transistor, a third transistor, a fourth transistor, a first source pad, and a second source pad. The first transistor and the second transistor are arranged along a first track of a first direction over the substrate. The first source pad is between the first and second transistors along the first track of the first direction and electrically connected with source regions of the first and second transistors. The third transistor and fourth transistor is arranged along a second track of the first direction over the substrate, and the second track of the first direction is parallel to and non-overlapped the first track of the first direction. The second source pad is between the third and fourth transistors along the second track of the first direction and electrically connected with source regions of the third and fourth transistors.

20 Claims, 10 Drawing Sheets

SEMICONDUCTOR STRUCTURE AND METHOD OF MANUFACTURING THE SAME

BACKGROUND

Field of Invention

The present invention relates to a semiconductor structure and a method of manufacturing the same. More particularly, the present invention relates to a semiconductor structure improving electrical performance.

Description of Related Art

In the original design, multiple MOS (metal-oxide-semiconductor) devices share one single source pad on one of the MOS device to optimize pad utilization. However, differences in electrical performance between MO and TV measurements arise due to varying routing distances from the source regions of each MOS device to the source pad. The placement of the same MOS device in different positions may lead to differing electrical performance due to the different resistances of the different routing lengths from the source regions of each MOS device to the source pad.

Therefore, there is a need for a semiconductor structure that can address the aforementioned issues.

SUMMARY

An aspect of the present disclosure provides a semiconductor structure. The semiconductor structure comprises a substrate, a first transistor, a second transistor, a third transistor, a fourth transistor, a first source pad, and a second source pad. The first transistor and the second transistor are arranged along a first track of a first direction over the substrate. The first source pad is between the first and second transistors along the first track of the first direction and electrically connected with source regions of the first and second transistors. The third transistor and fourth transistor is arranged along a second track of the first direction over the substrate, and the second track of the first direction is parallel to and non-overlapped the first track of the first direction. The second source pad is between the third and fourth transistors along the second track of the first direction and electrically connected with source regions of the third and fourth transistors.

In some embodiments of the present disclosure, the first source pad and a gate structure of the third transistor are arranged along a second direction substantially perpendicular to the first direction.

In some embodiments of the present disclosure, the semiconductor structure further comprises a first drain pad and a second drain pad. The first drain pad is electrically connected with a drain region of the first transistor. The second drain pad is electrically connected with a drain region of the second transistor. The first source pad is between the first drain pad and second drain pad along the first direction.

In some embodiments of the present disclosure, a distance between the first source pad and the source region of the first transistor is substantially the same as a distance between the first source pad and the source region of the second transistor.

In some embodiments of the present disclosure, the second drain pad and a gate structure of the fourth transistor are arranged along the second direction substantially perpendicular to the first direction.

In some embodiments of the present disclosure, the third transistor is between the first and second transistors along the first direction.

In some embodiments of the present disclosure, the second transistor is between the third and fourth transistors along the first direction.

In some embodiments of the present disclosure, the semiconductor structure further comprises an interlayer dielectric layer covering the first, second, third, and fourth transistors. The first and second source pads are disposed on the interlayer dielectric layer.

In some embodiments of the present disclosure, the semiconductor structure further comprises a gate conductive line and a gate pad. The gate conductive line is extending along the first direction and electrically connected with gate structures of the first and second transistors. The gate pad is connected to the gate conductive line. The gate pad and the first source pad are arranged along the first direction.

In some embodiments of the present disclosure, the first and the second source pads are spaced apart from each other.

Another aspect of the present disclosure provides a method of manufacturing a semiconductor structure. The method comprises the following steps: forming first, second, third, and fourth transistors over a substrate; forming an interlayer dielectric layer covering the first, second, third, and fourth transistors; and forming first and second source pads over the interlayer dielectric layer. The first transistor and the second transistor are arranged along a first track of a first direction. The third transistor and the fourth transistor are arranged along a second track of the first direction being parallel to and non-overlapping the first track of the first direction. The first source pad is electrically connected with source regions of the first and second transistors. The second source pad is electrically connected with source regions of the third and fourth transistors. The first source pad is between the first and second transistors along the first track of the first direction. The second source pad is between the third and fourth transistors along the second track of the first direction.

In some embodiments of the present disclosure, the first source pad and a gate structure of the third transistor are arranged along a second direction substantially perpendicular to the first direction.

In some embodiments of the present disclosure, the method further comprises forming a first drain pad and a second drain pad over the interlayer dielectric layer. The first drain is electrically connected with a drain region of the first transistor. The second drain pad is electrically connected with a drain region of the second transistor. The first source pad is between the first drain pad and the second drain pad along the first direction.

In some embodiments of the present disclosure, a distance between the first source pad and the source region of the first transistor is substantially the same as a distance between the first source pad and the source region of the second transistor.

In some embodiments of the present disclosure, the second drain pad and a gate structure of the fourth transistor are arranged along the second direction substantially perpendicular to the first direction.

In some embodiments of the present disclosure, the third transistor is between the first and second transistors along the first direction.

In some embodiments of the present disclosure, the second transistor is between the third and fourth transistors along the first direction.

In some embodiments of the present disclosure, the method further comprises forming a gate conductive line over the interlayer dielectric layer, and forming a gate pad over the interlayer dielectric. The gate conductive line is extending along the first direction and electrically connected with gate structures of the first and second transistors. The gate pad is connected to the gate conductive line. The gate pad and the first source pad are arranged along the first direction.

In some embodiments of the present disclosure, the method further comprises performing a testing process to measure electrical properties of the first, second, third, and fourth transistors at least by probing the first and second source pads. The first, second, third, and fourth transistors are formed over a scribe line region of the substrate. The scribe line region is between die regions of the substrate.

In some embodiments of the present disclosure, the method further comprises preforming a singulation process along the scribe line region to divide the die regions into individual dies after the testing process is complete.

The semiconductor structure of the present disclosure addresses the issue of varied performance of the same MOS device in different positions by employing a neighbor pad concept on MOS devices, ensuring that each distance from each source region of the MOS devices to the source pad is the same. This improvement enhances the accuracy of electrical performance measurements of MOS devices between MO and TV measurements. Additionally, the utilization of symmetric pad structures in the configuration of MOS devices allows for the design of more test-element-groups (TEGs) on the scribe line regions.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
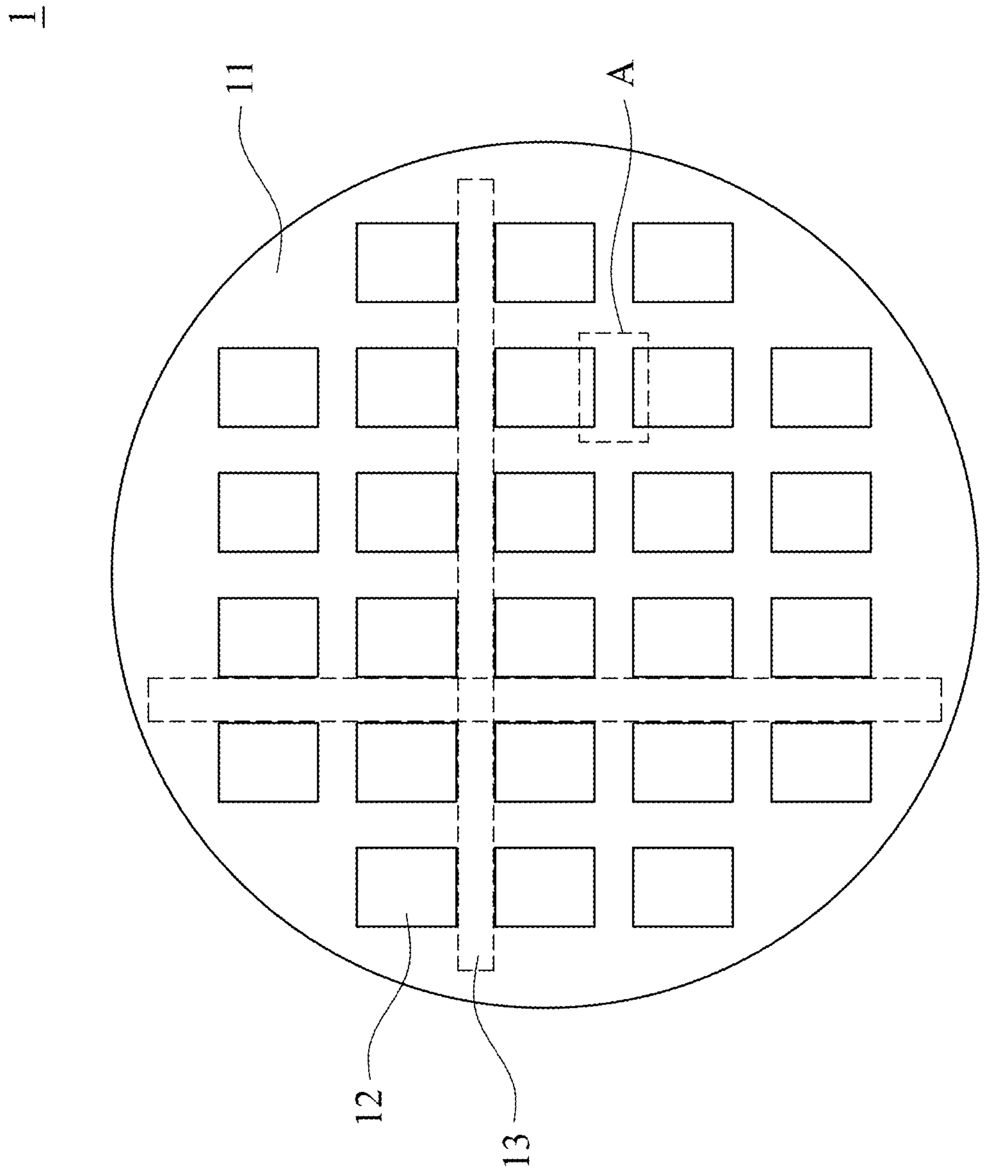
FIG. 1 is a schematic top view of a semiconductor wafer.

Reference will now be made in detail to the present embodiments of the disclosure, examples of which are illustrated in the accompanying drawings. Wherever possible, the same reference numbers are used in the drawings and the description to refer to the same or like parts.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that, although the terms first, second, etc. may be used herein to describe various elements, these elements should not be limited by these terms. Unless indicated otherwise, these terms are only used to distinguish one element from another element.

Unless the context indicates otherwise, terms such as “same,” “equal,” “planar,” or “coplanar,” as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term “substantially” may be used herein to reflect this meaning. For example, items described as “substantially the same,” “substantially equal,” or “substantially planar,” may be exactly the same, equal, or planar, or may be the same, equal, or planar within acceptable variations that may occur, for example, due to manufacturing processes.

Referring to FIG. 1, FIG. 1 is a schematic top view of a semiconductor wafer 1 according to some embodiments of the present disclosure. The semiconductor wafer 1 may include a substrate 11. The substrate 11 may include a plurality of die regions 12, which are separated from each other through a plurality of scribe line regions 13 over the surface of the substrate 11. In some embodiments, the substrate 11 may include a semiconductor material. In some embodiments, the substrate 11 may be or include a silicon substrate. The substrate 11 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 2:
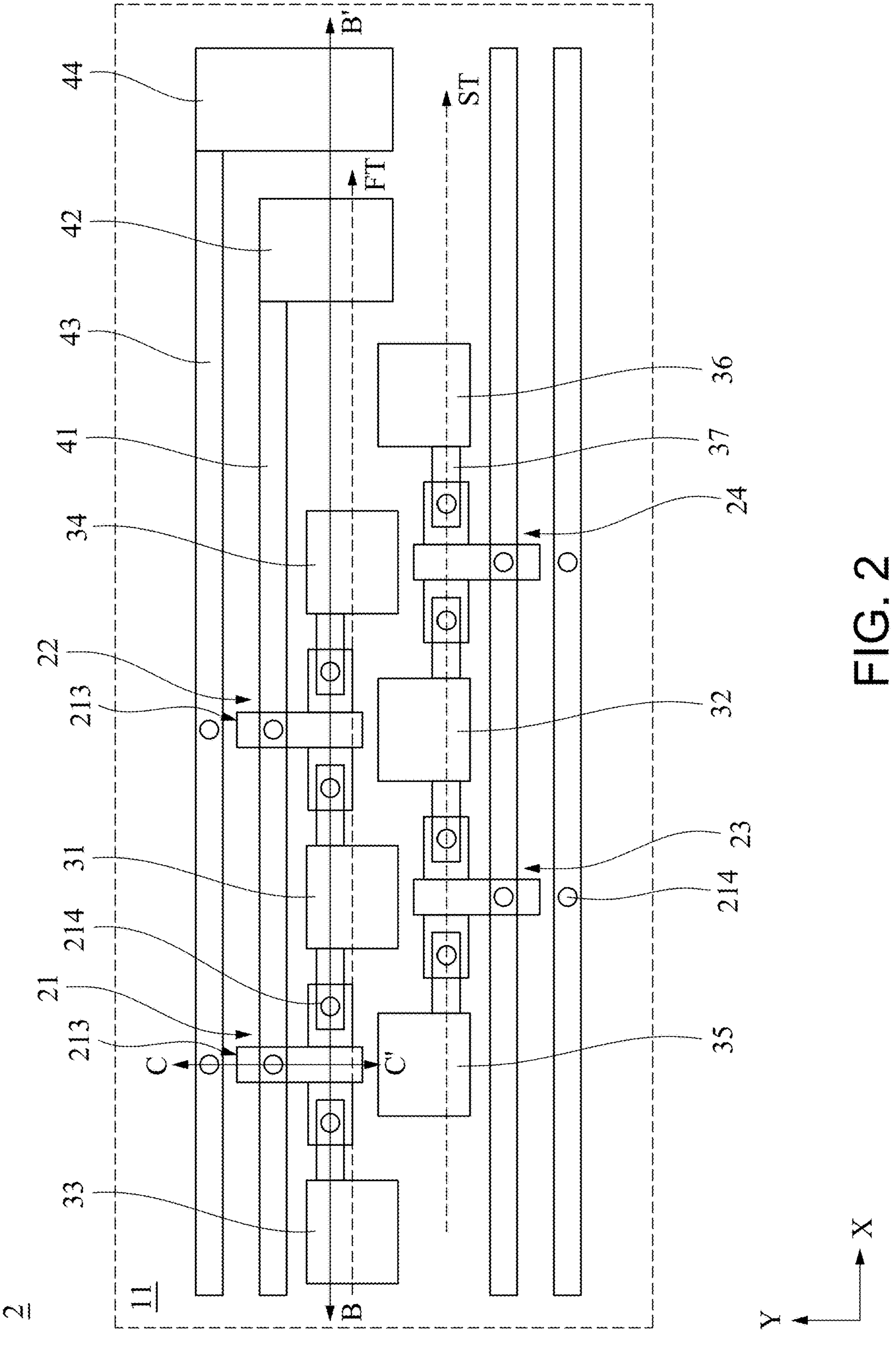
FIG. 2 is an enlarged view of a semiconductor structure at portion A of the semiconductor wafer shown in FIG. 1.
Figure 3:
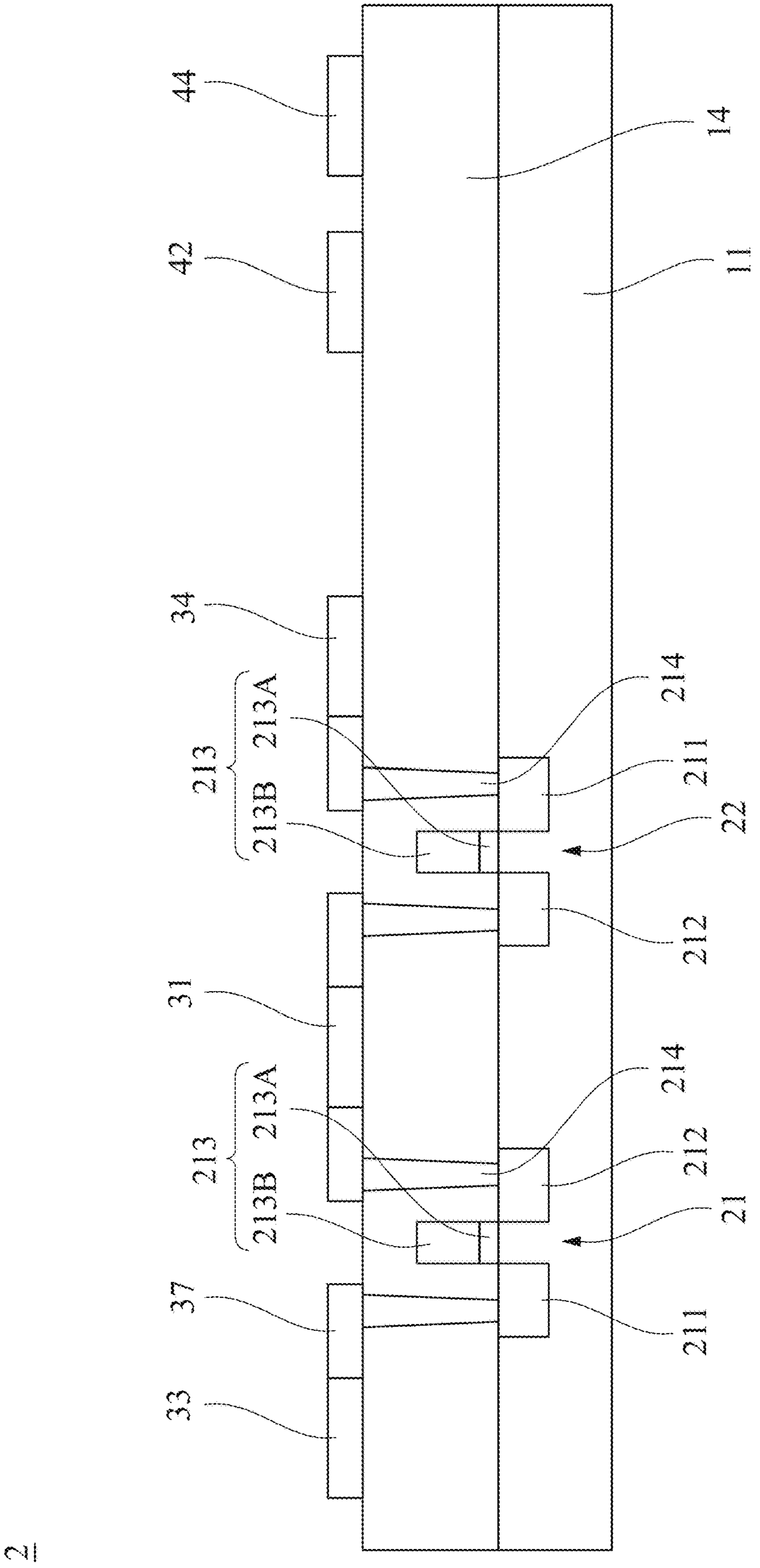
FIG. 3 is a cross-sectional view along a line B-B' shown in FIG. 2.
Figure 4:
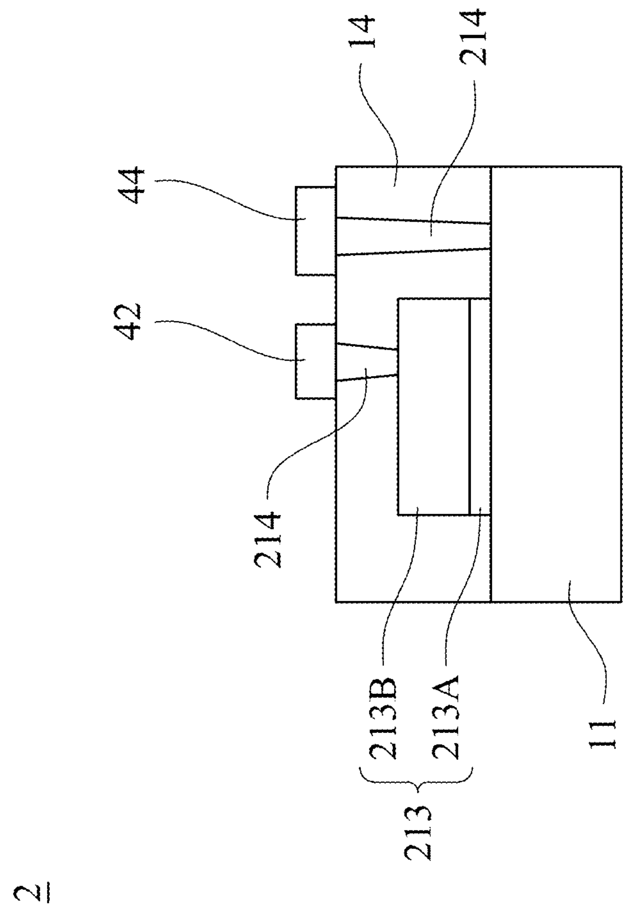
FIG. 4 is a cross-sectional view along a line C-C' shown in FIG. 2.

Referring to FIGS. 2, 3, and 4, FIG. 2 is an enlarged view of a semiconductor structure at portion A of the semiconductor wafer 1 shown in FIG. 1, and FIG. 3 and FIG. 4 are cross-sectional views of the semiconductor structure along a line B-B' and a line C-C' shown in FIG. 2, respectively. FIG. 2 illustrates a detail diagram of a semiconductor structure 2 according to some embodiments of the present disclosure.

As shown in the top view of FIG. 2, the semiconductor structure 2 may include a first transistor 21, a second transistor 22, a third transistor 23, and a fourth transistor 24. In the cross-sectional view of FIG. 3, the first transistor 21 and the second transistor 22 each may include a gate structure 213, and a drain region 211 and a source region 212 on opposite sides of the gate structure 213. It is noted that, although not shown in FIG. 3, the third transistor 23 and the fourth transistor 24 may include similar configuration as the first transistor 21 and the second transistor 22.

The gate structure 213 may include a gate dielectric 213A and a gate electrode 213B over the gate dielectric 213A. In some embodiments, the gate dielectric 213A may include oxide, such as silicon oxide. In other embodiments, the gate dielectric 213A may include high-k dielectric material. In some embodiments, the gate electrode 213B may include polysilicon or metal.

The semiconductor structure 2 may further include an interlayer dielectric layer 14 disposed over the substrate 11. The interlayer dielectric layer 14 covers the first transistor 21, the second transistor 22, the third transistor 23, and the fourth transistor 24. In some embodiments, the interlayer dielectric layer 14 may be a material has a low-k dielectric such as an oxide (e.g., $SiO2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like.

Referring to FIGS. 3 and 4, the semiconductor structure 2 further includes conductive vias 214 in the interlayer dielectric layer 14. In FIG. 3, portions of the conductive vias 214 may be electrically connected with the source regions 212 and the drain regions 211. In FIG. 4, portions of the conductive vias 214 may be electrically connected with the gate structure 213 and the substrate 11.

Referring to FIGS. 2, 3 and 4, the semiconductor structure 2 further includes source pads 31 and 32, drain pads 33, 34, 35, and 36, a gate pad 42, and a ground pad 44 disposed over the interlayer dielectric layer 14. The semiconductor structure 2 further includes conductive lines 37, 41 and 43 disposed over the interlayer dielectric layer 14.

In FIGS. 2 and 3, with respect to the source pad 31, the source pad 31 may be electrically connected to the source regions 212 of the first transistor 21 and the second transistor 22 through the respective conductive lines 37 and the conductive vias 214. That is, both of the source regions 212 of the first transistor 21 and the second transistor 22 are electrically connected with the source pad 31, and thus the source pad 31 can be referred to as a common source pad of the first transistor 21 and the second transistor 22. The structural relationship among the source pad 32 and the third transistor 23 and the fourth transistor 24 may be similar to those described above with respect to the source pad 31, and the source pad 32 can be referred to as a common source pad of the third transistor 23 and the fourth transistor 24.

The drain pads 33 and 34 may be electrically connected to the drain regions 211 of the first transistor 21 and the second transistor 22 through the respective conductive lines 37 and the conductive vias 214. Different from the common source pad 31, each of the first transistor 21 and the second transistor 22 may include an individual drain pad connected with its drain region 211. The structural relationship among the drain pads 35 and 36 and the third transistor 23 and the fourth transistor 24 may be similar to those described above with respect to the drain pads 33 and 34, and thus relevant details will not be repeated for brevity.

In FIGS. 2 and 4, with respect to the gate pad 42, the gate pad 42 may be electrically connected to the gate structures 213 of the first transistor 21 and the second transistor 22 through the conductive line 41 and the respective conductive vias 214. It is noted that there is also a conductive line electrically connected with the gate structures 213 of the third transistor 23 and the fourth transistor 24, and a gate pad (not shown) connected with the conductive line.

In FIGS. 2 and 4, with respect to the ground pad 44, the ground pad 44 may be electrically connected to portions of the substrate 11 adjacent to the gate structures 213 of the first transistor 21 and the second transistor 22 through the conductive line 43 and the respective conductive vias 214. In some embodiments, the ground pad 44 may act as a pick-up terminal of the first transistor 21 and the second transistor 22. It is noted that there is also a conductive line electrically connected with the portions of the substrate 11 adjacent to the gate structures 213 of the third transistor 23 and the fourth transistor 24, and a ground pad (not shown) connected with the conductive line.

In some embodiments, the conductive vias 214, the source pads 31 and 32, the drain pads 33, 34, 35, and 36, the gate pad 42, the ground pad 44, and the conductive lines 37, 41 and 43 may include metal such as tungsten (W), copper (Cu), aluminum (Al), gold (Au), silver (Ag), platinum (Pt), or the like.

In some embodiments, the drain pad 33, the first transistor 21, the source pad 31, the second transistor 22, and the drain pad 34 may be arranged in the order along a first track FT of a first direction X over the substrate 11. That is, the first transistor 21 and the second transistor 22 may be arranged along the first track FT of the first direction X over the substrate 11. The source pad 31 may be between the first transistor 21 and the second transistor 22 along the first track FT of the first direction X. Moreover, the source pad 31 may be between the drain pad 33 and the drain pad 34 along the first direction X.

In some embodiments, the drain pad 35, the third transistor 23, the source pad 32, the fourth transistor 24, and the drain pad 36 may be arranged in the order along a second track ST of the first direction X over the substrate 11. The second track ST of the first direction X may be parallel to and non-overlapping the first track FT of the first direction X. That is, the third transistor 23 and the fourth transistor 24 may be arranged along the second track ST of the first direction X over the substrate 11. The source pad 32 may be between the third transistor 23 and fourth transistor 24 along the second track ST of the first direction X. Moreover, the source pad 32 may be between the drain pad 35 and the drain pad 36 along the first direction X.

In some embodiments, a distance between the source pad 31 and the source region 212 of the first transistor 21 may be substantially the same as a distance between the source pad 31 and the source region 212 of the second transistor 22. With such configuration, the issue of varied performance of the same device in different positions may be solved by making the distance from each source region of different transistors to the respective source pad the same. The semiconductor structure of the present disclosure can enhance the accuracy of electrical performance measurements of MOS devices between MO and TV measurements.

In some embodiments, the source pad 31 and the gate structure 213 of the third transistor 23 may be arranged along a second direction Y substantially perpendicular to the first direction X. In some embodiments, the drain pad 34 and the gate structure 213 of the fourth transistor 24 may be arranged along the second direction Y.

In some embodiments, the third transistor 23 may be between the first transistor 21 and the second transistor 22 along the first direction X. In some embodiments, the second transistor 22 may be between the third transistor 23 and fourth transistor 24 along the first direction X. The utilization of symmetric pad structures in the configuration of MOS devices allows for the design of more TEGs on the scribe line regions.

In some embodiments, the source pad 31 and the source pad 32 may be spaced apart from each other.

The gate conductive line 41 may extend along the first direction X. The gate pad 42 and the source pad 31 may be arranged along the first direction X.

The ground conductive line 43 may extend along the first direction X. The ground pad 44 and the source pad 31 may be arranged along the first direction X.

Figure 5A:
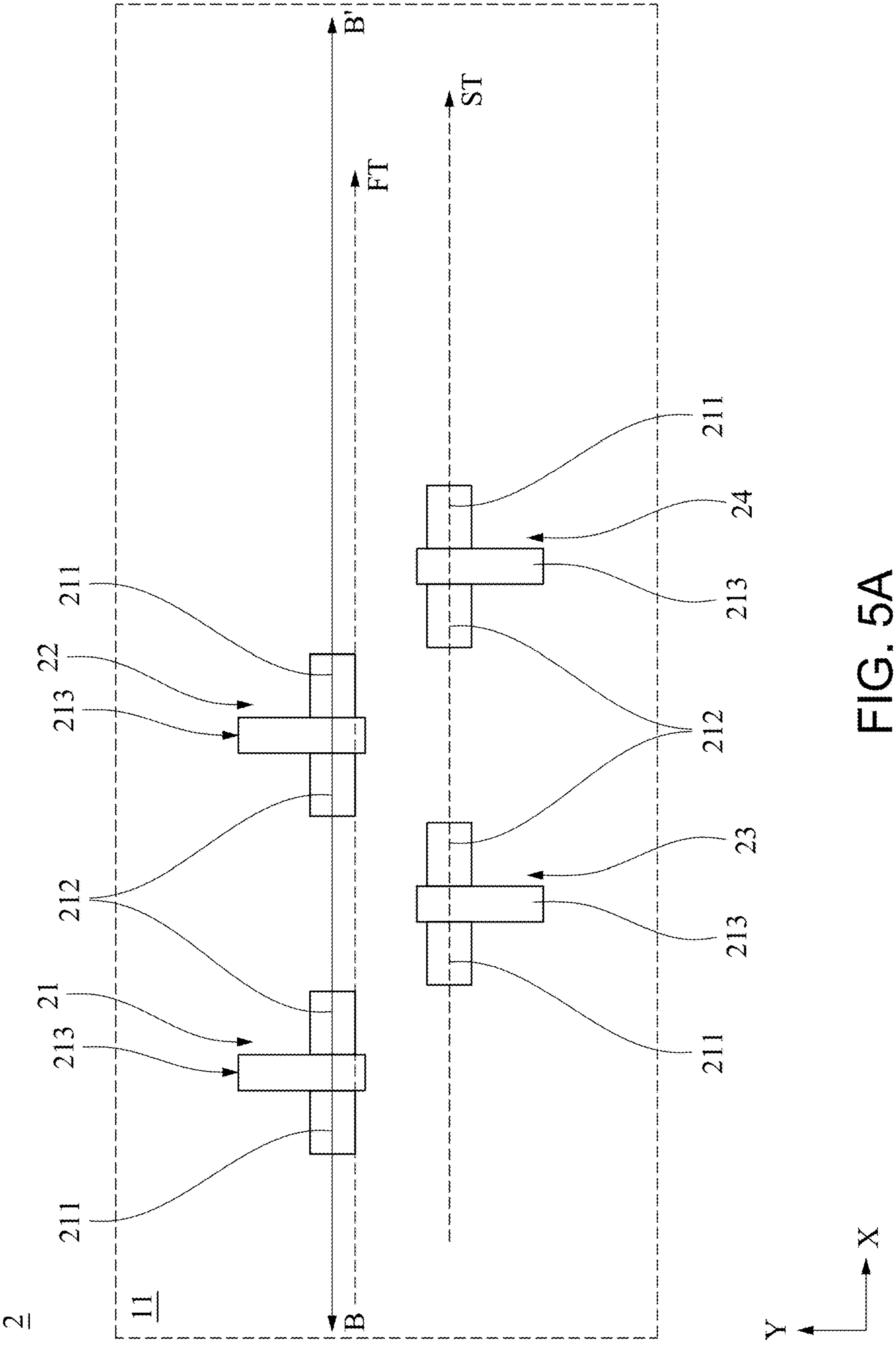
FIGS. 5A to 7B illustrate a method in various stages of forming a semiconductor structure in accordance with some embodiments of the present disclosure.
Figure 5B:
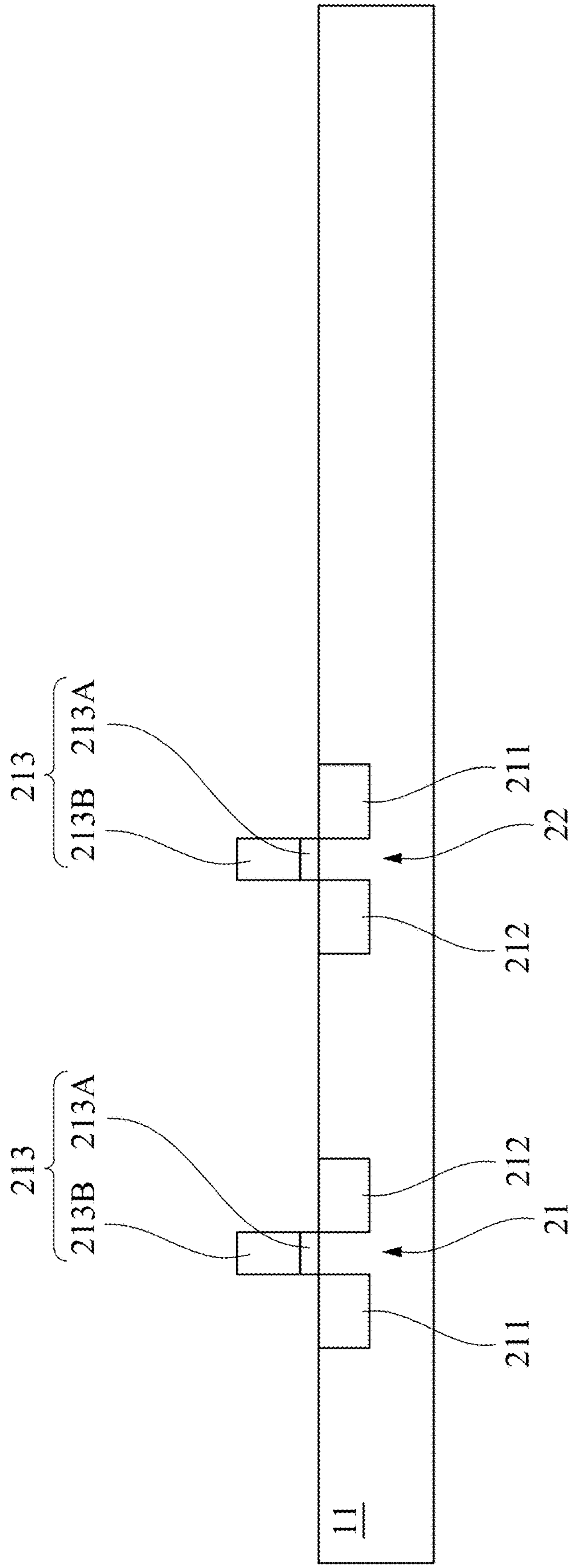
Figure 6A:
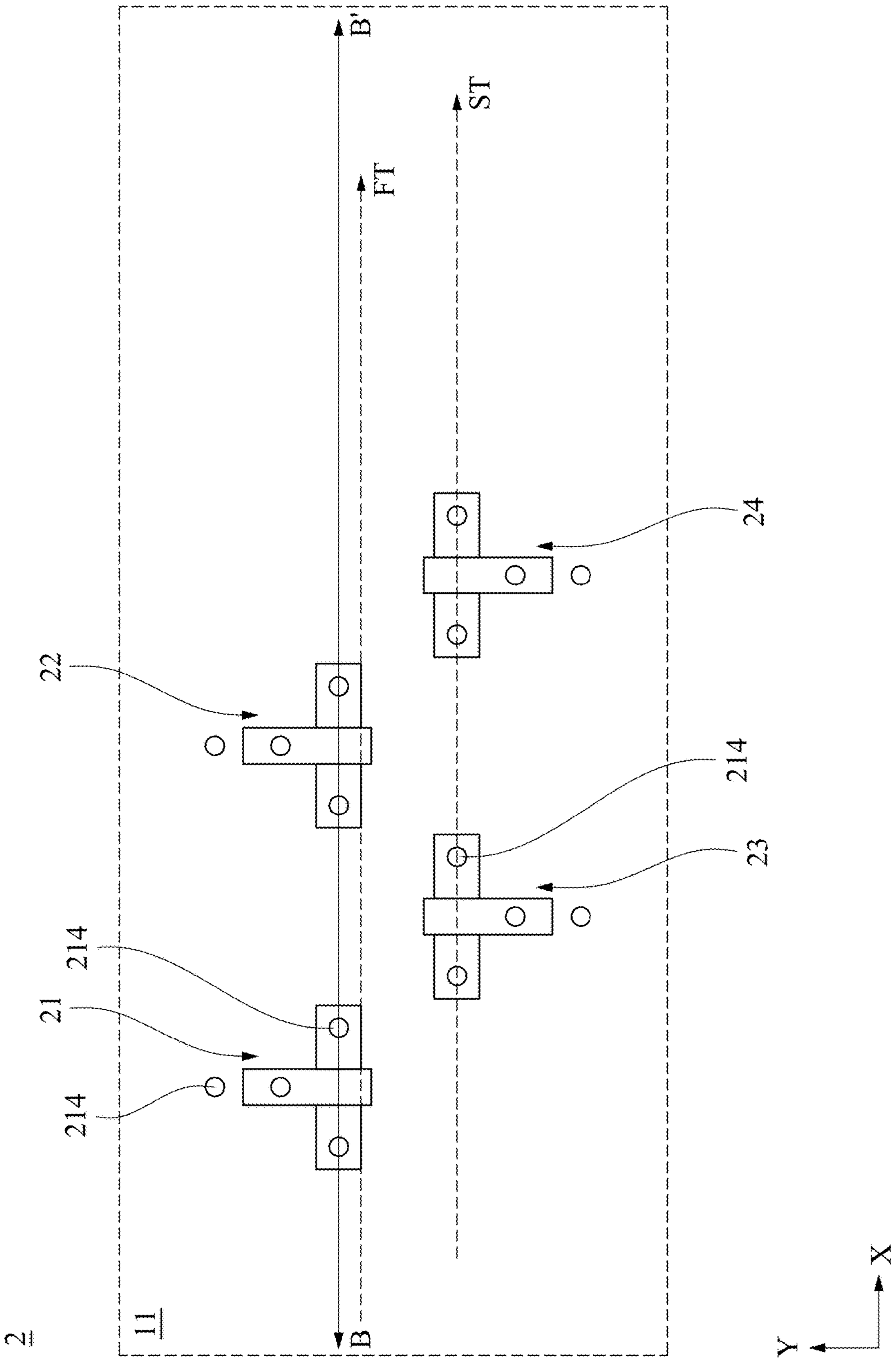
Figure 6B:
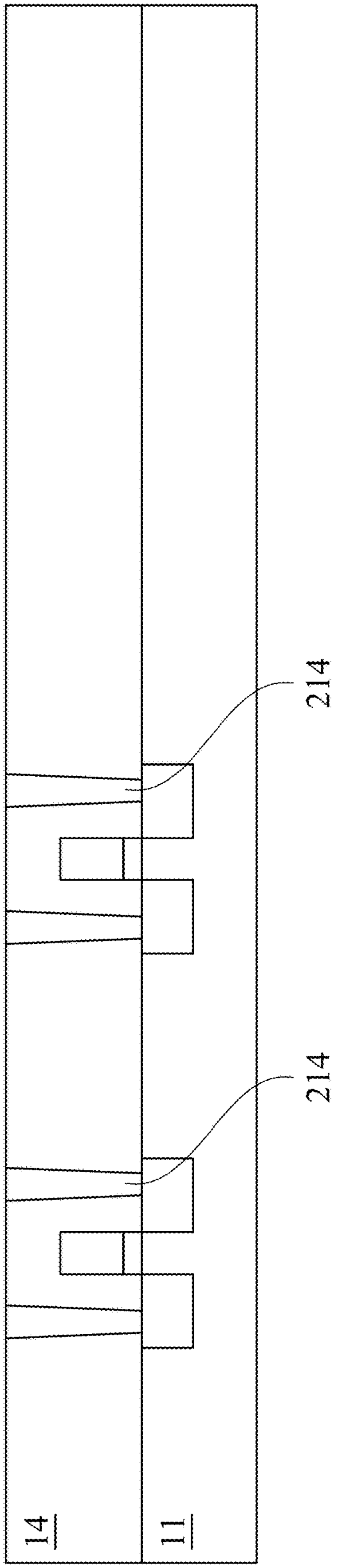
Figure 7A:
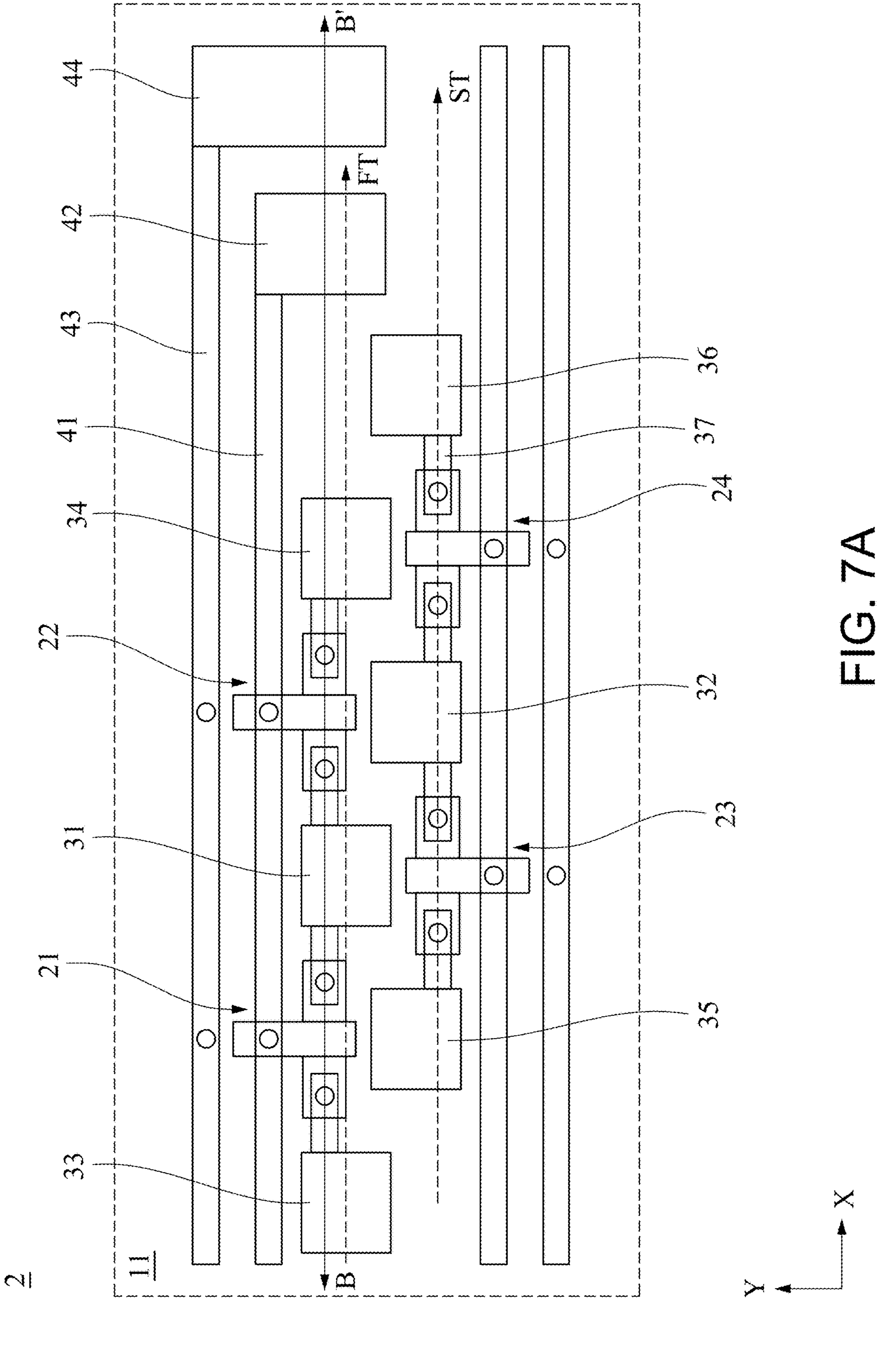
Figure 7B:
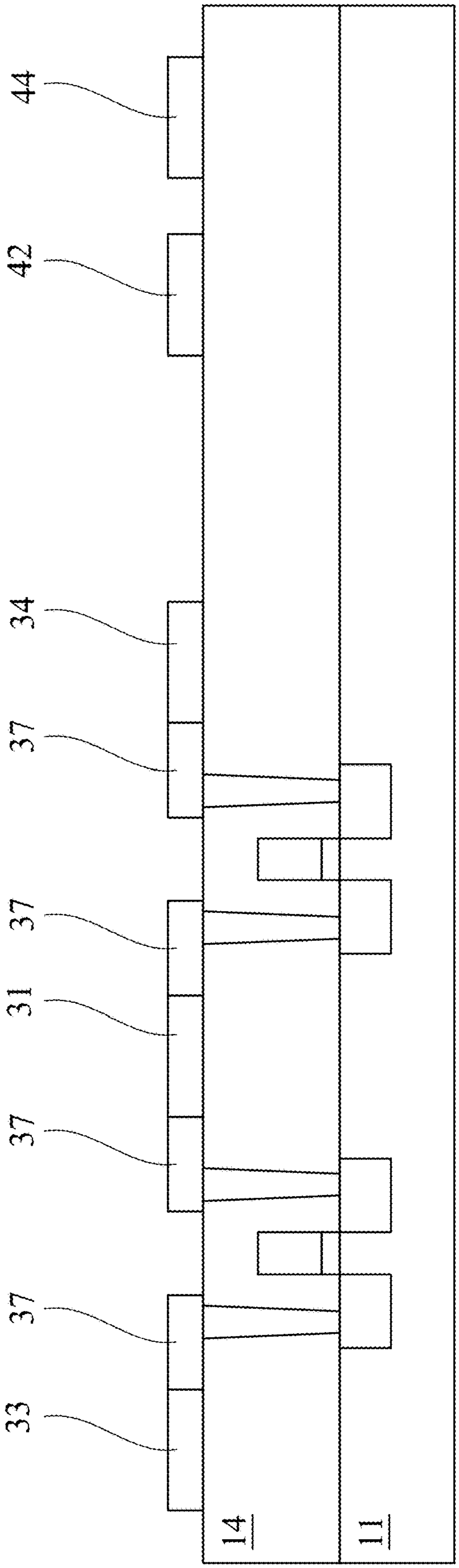

FIGS. 5A to 7B illustrate a method in various stages of forming a semiconductor structure in accordance with some embodiments of the present disclosure. In greater detail, FIGS. 5A, 6A, and 7A are top views of a semiconductor structure, and FIGS. 5B, 6B, and 7B are cross-sectional view along line B-B' of FIGS. 5A, 6A, and 7A, respectively. The order in which some or all of the operations are described should not be construed to imply that these operations are necessarily order dependent. Alternative ordering will be appreciated having the benefit of this description. Additional operations can be provided before, during, and/or after these operations, and may be briefly described herein. Further, it will be understood that not all operations are necessarily present in each embodiment provided herein. Also, it will be understood that not all operations are necessary in some embodiments.

Referring to FIG. 5A and FIG. 5B, FIG. 5A and FIG. 5B illustrate an operation of forming a first transistor 21, a second transistor 22, a third transistor 23, and a fourth transistor 24 over a substrate 11. Each of the first transistor 21, the second transistor 22, the third transistor 23, and the fourth transistor 24 may include a gate structure 213 and source region 212 and drain region 211 on opposite sides of the gate structure 213. The gate structures 213 may be formed by, for example, depositing a material of the gate dielectric 213A and a material of the gate electrode 213B over the substrate 11, and then patterning the material of the gate dielectric 213A and the material of the gate electrode 213B to form the gate structures 213. The source regions 212 and the drain regions 211 may be formed by, for example, performing one or more implantation processes to dope portions of the substrate 11 on opposite sides of each gate structure 213.

Referring to FIG. 6A and FIG. 6B, FIG. 6A and FIG. 6B illustrate an operation of forming an interlayer dielectric layer 14 over the substrate 11 and covering the first transistor 21, the second transistor 22, the third transistor 23, and the fourth transistor 24. The interlayer dielectric layer 14 may be formed, for example, using suitable deposition process, such as chemical vapor deposition (CVD), atomic layer deposition (ALD), or other suitable deposition. Afterwards, conductive vias 214 are formed in the interlayer dielectric layer 14. The conductive vias 214 may be formed by, for example, patterning the interlayer dielectric layer 14 to form openings that expose corresponding gate structures 213, the source regions 212, the drain regions 211, and the substrate 11, filling the openings with a conductive material, and performing a planarization process to remove excess conductive material until the interlayer dielectric layer 14 is exposed.

Referring to FIG. 7A and FIG. 7B, FIG. 7A and FIG. 7B illustrate an operation of forming a source pad 31, a source pad 32, a drain pad 33, a drain pad 34, a drain pad 35, a drain pad 36, conductive lines 37, gate conductive lines 41, and ground conductive lines 43 over the interlayer dielectric layer 14. For example, the above structures may be formed by depositing a conductive layer over the interlayer dielectric layer 14, and then patterning the conductive layer according to a predetermined pattern.

It is understood that the first transistor 21, the second transistor 22, the third transistor 23, and the fourth transistor 24 may be formed on test element groups (TEGs) of the wafer. Here, the TEGs is formed on scribe line regions of the wafer (e.g., the scribe line regions 13 of FIG. 1) that can be used to determine whether elements formed thereon are suitably formed in die regions on the wafer (e.g., the die regions 12 of FIG. 1). Accordingly, the properties of the integrated circuit dies can be correctly deduced by testing the TEGs.

In some embodiments, a testing process may be performed to measure electrical properties of the first transistor 21, the second transistor 22, the third transistor 23, and the fourth transistor 24. For example, if the first transistor 21 is tested, the electrical properties of the first transistor 21 may be determined by probing the gate pad 42, the source pad 31, the drain pad 33, and the ground pad 44. Similarly, if the second transistor 22 is tested, the electrical properties of the second transistor 22 may be determined by probing the gate pad 42, the source pad 31, the drain pad 34, and the ground pad 44. The third transistor 23 and the fourth transistor 24 may also be tested in a similar way, and thus relevant details are not repeated for brevity.

Once the properties of the first transistor 21, the second transistor 22, the third transistor 23, and the fourth transistor 24 have been tested (e.g., the testing process is complete), a singulation process may be performed along the scribe line regions of the wafer (e.g., the scribe line region 13 of FIG. 1) to divide the die regions (e.g., the die regions 12 of FIG. 1) into individual dies after the testing process is complete.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:

a substrate;

a first transistor and a second transistor arranged along a first track of a first direction over the substrate;

a first source pad between the first and second transistors along the first track of the first direction and electrically connected with source regions of the first and second transistors;

a third transistor and a fourth transistor arranged along a second track of the first direction over the substrate, the second track of the first direction being parallel to and non-overlapping the first track of the first direction; and a second source pad between the third and fourth transistors along the second track of the first direction and electrically connected with source regions of the third and fourth transistors.

2. The semiconductor structure of claim 1, wherein the first source pad and a gate structure of the third transistor are arranged along a second direction substantially perpendicular to the first direction.

3. The semiconductor structure of claim 1, further comprising:

a first drain pad electrically connected with a drain region of the first transistor; and a second drain pad electrically connected with a drain region of the second transistor, wherein the first source pad is between the first drain pad and the second drain pad along the first direction.

4. The semiconductor structure of claim 3, wherein a distance between the first source pad and the source region of the first transistor is substantially the same as a distance between the first source pad and the source region of the second transistor.

5. The semiconductor structure of claim 3, wherein the second drain pad and a gate structure of the fourth transistor are arranged along a second direction substantially perpendicular to the first direction.

6. The semiconductor structure of claim 1, wherein the third transistor is between the first and second transistors along the first direction.

7. The semiconductor structure of claim 6, wherein the second transistor is between the third and fourth transistors along the first direction.

8. The semiconductor structure of claim 1, further comprising an interlayer dielectric layer covering the first, second, third, and fourth transistors, wherein the first and second source pads are disposed on the interlayer dielectric layer.

9. The semiconductor structure of claim 1, further comprising:

a gate conductive line extending along the first direction and electrically connected with gate structures of the first and second transistors; and a gate pad connected to the gate conductive line, wherein the gate pad and the first source pad are arrange along the first direction.

10. The semiconductor structure of claim 1, wherein the first and the second source pads are spaced apart from each other.

11. A method of manufacturing a semiconductor structure, comprising:

forming first, second, third, and fourth transistors over a substrate, wherein:

the first transistor and the second transistor are arranged along a first track of a first direction, and the third transistor and the fourth transistor are arranged along a second track of the first direction being parallel to and non-overlapping the first track of the first direction;

forming an interlayer dielectric layer covering the first, second, third, and fourth transistors; and forming first and second source pads over the interlayer dielectric layer, the first source pad being electrically connected with source regions of the first and second transistors, and the second source pad being electrically connected with source regions of the third and fourth transistors, wherein:

the first source pad is between the first and second transistors along the first track of the first direction, and the second source pad is between the third and fourth transistors along the second track of the first direction.

12. The method of claim 11, wherein the first source pad and a gate structure of the third transistor are arranged along a second direction substantially perpendicular to the first direction.

13. The method of claim 11, further comprising:

forming a first drain pad and a second drain pad over the interlayer dielectric layer, the first drain pad being electrically connected with a drain region of the first transistor, and the second drain pad being electrically connected with a drain region of the second transistor, wherein the first source pad is between the first drain pad and the second drain pad along the first direction.

14. The method of claim 13, wherein a distance between the first source pad and the source region of the first transistor is substantially the same as a distance between the first source pad and the source region of the second transistor.

15. The method of claim 13, wherein the second drain pad and a gate structure of the fourth transistor are arranged along a second direction substantially perpendicular to the first direction.

16. The method of claim 11, wherein the third transistor is between the first and second transistors along the first direction.

17. The method of claim 16, wherein the second transistor is between the third and fourth transistors along the first direction.

18. The method of claim 11, further comprising:

forming a gate conductive line over the interlayer dielectric layer, the gate conductive line being extending along the first direction and electrically connected with gate structures of the first and second transistors; and forming a gate pad over the interlayer dielectric layer, the gate pad being connected to the gate conductive line, wherein the gate pad and the first source pad are arrange along the first direction.

19. The method of claim 11, wherein the first, second, third, and fourth transistors are formed over a scribe line region of the substrate, the scribe line region being between die regions of the substrate, and the method further comprises:

performing a testing process to measure electrical properties of the first, second, third, and fourth transistors at least by probing the first and second source pads.

20. The method of claim 19, further comprising:

after the testing process is complete, preforming a singulation process along the scribe line region to divide the die regions into individual dies.

* * * * *